United States Patent
Tombak et al.

(10) Patent No.: US 8,706,070 B2
(45) Date of Patent: Apr. 22, 2014

(54) RF SYSTEM FOR REDUCING INTERMODULATION (IM) PRODUCTS

(75) Inventors: Ali Tombak, High Point, NC (US);
Joshua J. Caron, Madison, NC (US);
Daniel Charles Kerr, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 238 days.

(21) Appl. No.: 13/272,537

(22) Filed: Oct. 13, 2011

(65) Prior Publication Data

US 2012/0238230 A1    Sep. 20, 2012

Related U.S. Application Data

(60) Provisional application No. 61/452,874, filed on Mar. 15, 2011.

(51) Int. Cl.
*H04B 1/10* (2006.01)

(52) U.S. Cl.
USPC ............ 455/295; 455/296; 455/304; 375/296

(58) Field of Classification Search
USPC ....................... 455/295, 296, 304, 310, 276.1; 375/296, 297; 330/149
See application file for complete search history.

(56) References Cited

U.S. PATENT DOCUMENTS

| | | | |
|---|---|---|---|
| 6,392,779 B1 * | 5/2002 | Iannelli et al. | 359/245 |
| 6,496,064 B2 * | 12/2002 | Rzyski | 330/149 |
| 6,757,338 B1 * | 6/2004 | Kim et al. | 375/296 |
| 7,693,674 B2 * | 4/2010 | Rzyski et al. | 702/111 |
| 2002/0070803 A1 * | 6/2002 | Rzyski | 330/149 |
| 2007/0032976 A1 * | 2/2007 | Rzyski et al. | 702/111 |
| 2008/0197936 A1 | 8/2008 | Berg | |
| 2009/0015508 A1 | 1/2009 | Prikhodko et al. | |
| 2010/0049463 A1 * | 2/2010 | Rzyski et al. | 702/111 |
| 2013/0169378 A1 | 7/2013 | Kim et al. | |

OTHER PUBLICATIONS

Final Office Action for U.S. Appl. No. 13/170,593, mailed Apr. 5, 2013, 8 pages.
Final Office Action for U.S. Appl. No. 13/170,593, mailed May 20, 2013, 6 pages.
Non-final Office Action for U.S. Appl. No. 13/170,593 mailed Dec. 13, 2012, 6 pages.
Non-Final Office Action for U.S. Appl. No. 13/197,216, mailed Sep. 4, 2013, 6 pages.
Non-Final Office Action for U.S. Appl. No. 13/170,593, mailed Jul. 19, 2013, 6 pages.
Final Office Action for U.S. Appl. No. 13/170,593, mailed Dec. 16, 2013, 9 pages.
Notice of Allowance for U.S. Appl. No. 13/197,216, mailed Dec. 11, 2013, 9 pages.

* cited by examiner

*Primary Examiner* — Minh D Dao
(74) *Attorney, Agent, or Firm* — Withrow & Terranova, P.L.L.C.

(57) ABSTRACT

An RF system for reducing intermodulation (IM) products is disclosed. The RF system includes a first nonlinear element and a second nonlinear element, wherein the second nonlinear element generates inherent IM products and the first nonlinear element is adapted to generate compensating IM products. Alternatively, the first nonlinear element generates inherent IM products and the second nonlinear element is adapted to generate compensating IM products. The amplitudes of the compensating IM products are substantially equal to amplitudes of the inherent IM products. The RF system further includes a phase shifter that is adapted to provide a phase shift that results in around 180° of phase shift between the inherent IM products and the compensating IM products. The phase shifter is coupled between the first nonlinear element and the second nonlinear element.

30 Claims, 16 Drawing Sheets

RF SYSTEM FOR REDUCING INTERMODULATION (IM) PRODUCTS

RELATED APPLICATIONS

This application claims the benefit of provisional patent application Ser. No. 61/452,874, filed Mar. 15, 2011, the disclosure of which is hereby incorporated herein by reference in its entirety. This application is related to U.S. patent application Ser. No. 13/170,593 entitled RADIO FREQUENCY SWITCH FOR SUPPRESSING INTERMODULATION filed Jun. 28, 2011, the disclosure of which is incorporated herein by reference in its entirety.

FIELD OF THE DISCLOSURE

The present disclosure relates to reducing intermodulation (IM) products generated by nonlinear elements used in wireless communication products such as mobile terminals.

BACKGROUND

It is well known that mobile terminal operation can be degraded by the presence of a strong interfering signal. For example, a nearby mobile terminal or base station operating at a different frequency can produce strong interfering signals. Furthermore, communications industries, and in particular, the cellular communication industry desires an ability to transmit and receive signals in two separate bands at the same time within a single mobile terminal. However, implementing such a request practically guarantees strong signal interference within the single mobile terminal.

In the short term, a desire to talk and surf the web simultaneously on a single band is not possible due to shortcomings in the Evolution-Data Optimized (EVDO) standard. As a result of these shortcomings, a requirement has emerged for mobile terminals that can operate simultaneously on code division multiple access (CDMA) Band 5 for voice and long term evolution (LTE) Band 13 for data. This requirement is known as simultaneous voice/LTE (SV-LTE).

Unfortunately, due to the aforementioned interference problems, SV-LTE cannot be facilitated by simply operating two cellular front ends at the same time. The major reason that a strong interferer signal degrades mobile terminal operation is a generation of third-order intermodulation (IM3) products in nonlinear electronic components such as RF switches that the signals encounter. This nonlinear phenomenon is a result of compression and/or clipping of the high-power signals as their levels exceed the linear dynamic range of the electronic components. If a signal A is incident upon an electronic component that compresses the signal A, a resulting signal $A_{compressed}$ can be modeled with an odd-order power series as follows in expression (1):

$$A \rightarrow A_{compressed} = \alpha_0 A - \alpha_1 A^3 + \alpha_2 A^5 - \alpha_3 A^7 + \ldots \quad (1)$$

If the compression is relatively light, the coefficients $\alpha_2$, $\alpha_3$, and higher are negligibly small, and the power series can be truncated after the cubic term $\alpha_1 A^3$. Therefore, the signal $A_{compressed}$ is approximated by expression (2).

$$A_{compressed} \approx \alpha_0 A - \alpha_1 A^3. \quad (2)$$

Now consider the signal A and another signal B that simultaneously engage an electronic component. If the electronic component is perfectly linear, a resultant signal is a superposition of the signal A and the signal B (i.e., A+B). However, practical electronic components suffer from various degrees of nonlinearity. Therefore, a cubic third-order term $\alpha_1(A+B)^3$ is included in expression (3) to more accurately model the resultant signal $(A+B)_{compressed}$.

$$(A+B) \rightarrow (A+B)_{compressed} \approx \alpha_0(A+B) - \alpha_1(A+B)^3. \quad (3)$$

Expanding the (A+B) of the cubic third order term $\alpha_1(A+B)^3$ into a full polynomial yields the expression (4).

$$(A+B)^3 = A^3 + 3A^2B + 3AB^2 + B^3 \quad (4)$$

If the signal A and the signal B are both sinusoidal the following expressions (5a) and (5b) are given.

$$A = a \cdot \sin(\omega_1 t + \phi_1) \quad (5a)$$

$$B = b \cdot \sin(\omega_2 t + \phi_2), \quad (5b)$$

The following trigonometric identities represented by expressions (6), (7), and (8) can be applied to expression (4).

$$\sin^3 x = \frac{1}{4}(3 \sin x + \sin 3x) \quad (6)$$

$$\sin^2 x = \frac{1}{2}(1 - \cos 2x) \quad (7)$$

$$\sin x \cos y = \frac{1}{2}[\sin(x+y) + \sin(x-y)]. \quad (8)$$

Expanding out the third-order polynomial from expression (4) using the sinusoidal signals of expressions (5a) and (5b), it can be seen that the cubic third order term $\alpha_1(A+B)^3$ results in additional frequency content as shown below in expression (9).

$$[a \cdot \sin(\omega_1 + \phi_1) + b \cdot \sin(\omega_2 + \phi_2)]^3 = (3/4 a^3 + 3/2 ab^2) \cdot \sin(\omega_1 t + \phi_1) + \quad (9)$$
$$(3/4 b^3 + 3/2 a^2 b) \cdot \sin(\omega_2 t + \phi_2) - 1/4 a^3 \sin(3\omega_1 t + 3\phi_1) -$$
$$1/4 b^3 \sin(3\omega_2 t + 3\phi_2) - 3/2 a^2 b \sin([2\omega_1 + \omega_2] t + 2\phi_1 + \phi_2) -$$
$$3/2 ab^2 \sin([\omega_1 + 2\omega_2] t + \phi_1 + 2\phi_2) +$$
$$3/2 a^2 b \sin([2\omega_1 - \omega_2] t + 2\phi_1 - \phi_2) +$$
$$3/2 ab^2 \sin([-\omega_1 + 2\omega_2] t - \phi_1 + 2\phi_2).$$

In addition to the original frequencies, $\omega_1$ and $\omega_2$, the expression (9) demonstrates that compression results in new products at the third harmonic frequencies, $3\omega_1$ and $3\omega_2$, as well as four additional intermodulation frequencies, $2\omega_1 \pm \omega_2$ and $2\omega_2 \pm \omega_1$. These last four are third order intermodulation (IM3) products, and two in particular, $2\omega_1 - \omega_2$ and $2\omega_2 - \omega_1$, tend to be problematic because they are relatively close in frequency to the original signals. As a result, the $2\omega_1 - \omega_2$ and $2\omega_2 - \omega_1$ IM3 products cannot be easily attenuated with a simple low-pass filter. Hereinafter, following the assumption that $\omega_2 > \omega_1$, the IM3 product $2\omega_1 - \omega_2$ is designated as $IM3_{down}$ and the IM3 product $2\omega_2 - \omega_1$ is designated as $IM3_{up}$ to represent the IM3 products just below and just above the transmit frequencies, respectively. Furthermore, subsequent references herein to "IM3 products" will refer only to $IM3_{up}$ and $IM3_{down}$, as the two additional IM3 products at $2\omega_1 + \omega_2$ and $2\omega_2 + \omega_1$ are not a particular concern of this disclosure.

FIG. 1 is a frequency spectrum for universal mobile telecommunications system (UMTS) band 5 (B5) and evolved UMTS terrestrial radio access (E-UTRA) band 13 (B13). The frequency spectrum of FIG. 1 illustrates the impact of the $IM3_{up}$ and $IM3_{down}$ products generated by the simultaneous transmission of the signals A and B. Nonlinearity of electronic components is especially problematic in the case of SV-LTE because certain transmit channel combinations result in IM3 products that fall directly within the pass bands of the receivers. Therefore, unless such IM3 products can be dramatically reduced, receivers impacted by the IM3 products can be severely de-sensed and a mobile terminal that incorporates the impacted receivers will become essentially useless as long as the IM3 products are present.

FIG. 2 is a diagram illustrating a related art approach for reducing power in the IM3 products generated by a first nonlinear switch 10 and a second nonlinear switch 12. A first antenna 14 is used for transmission and reception of signals in a first band (B5) and a second antenna 16 is used for transmission and reception of a second band (B13). Since the first antenna 14 and the second antenna 16 can be designed to provide ~10 dB of isolation, the resulting IM3 products can be reduced proportionally. However, even a 10 dB reduction in IM3 products requires a linearity that is on the order of 10-20 dB higher than current state-of-the-art electronic components such as the first nonlinear switch 10 and the second nonlinear switch 12. As such, there remains a need for additional intermodulation (IM) suppression to further reduce IM3 products and other IM products generated by RF systems having nonlinear elements that include nonlinear components that can be, but are not limited to filters, duplexers, RF switches, and combinations thereof.

SUMMARY

The present disclosure provides an RF system for reducing intermodulation (IM) products. The RF system includes a first nonlinear element and a second nonlinear element. The second nonlinear element generates inherent IM products and the first nonlinear element is adapted to generate compensating IM products. Alternatively, the first nonlinear element generates inherent IM products and the second nonlinear element is adapted to generate compensating IM products. The amplitudes of the compensating IM products are substantially equal to amplitudes of the inherent IM products. The RF system further includes a phase shifter that is adapted to provide a phase shift that results in around 180° of phase shift between the inherent IM products and the compensating IM products. The phase shifter is coupled between the first nonlinear element and the second nonlinear element.

Although the disclosure is directed mainly towards RF systems such as RF switches, the concepts disclosed are applicable to RF systems comprising nonlinear components other than RF switches. For the purpose of this disclosure RF systems include nonlinear components that can be, but are not limited to, filters, duplexers, RF switches, and combinations thereof.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 8 depicts an embodiment of the RF system that is usable in RF front-ends, the RF system being in the form of an RF switch having an auxiliary branch that is normally on.

FIG. 12 depicts an embodiment of the RF system in the form of an RF switch having a first nonlinear element with a shunt branch that is normally off and a series branch that is normally on, and a second nonlinear element having series branches that are normally off and shunt branches that are normally on.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
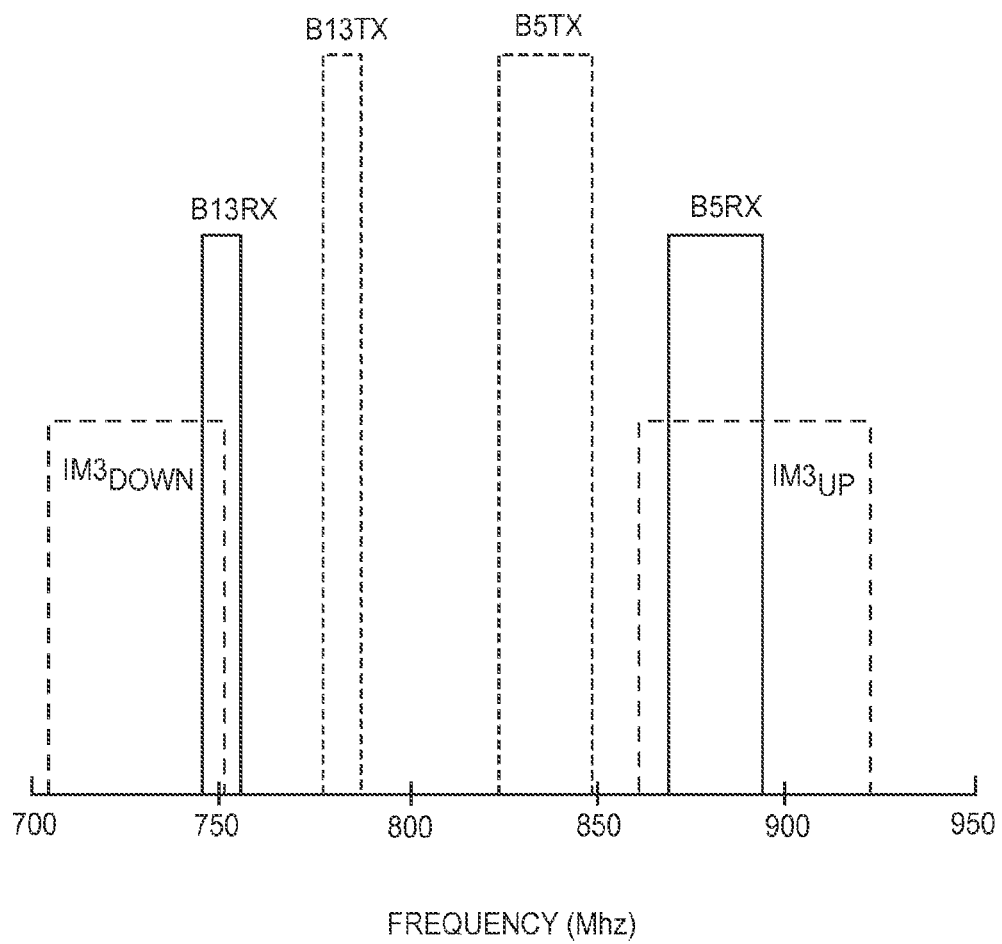
FIG. 1 is a frequency spectrum diagram for universal mobile telecommunications system (UMTS) band 5 and evolved UMTS terrestrial radio access (E-UTRA) Band 13 that illustrates the impact of undesirable third order intermodulation (IM3) products on receive (RX) bands.
Figure 2:
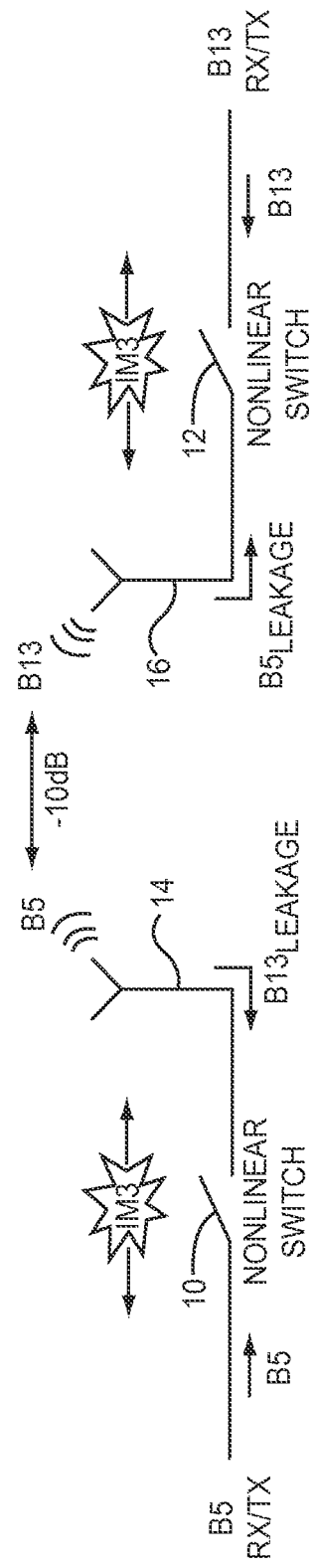
FIG. 2 is a diagram illustrating a related art attempt at relaxing RF switch linearity requirements by utilizing separate antennas transmit and receive paths for the Band 5 (B5) and Band 13 (B13).
Figure 3:
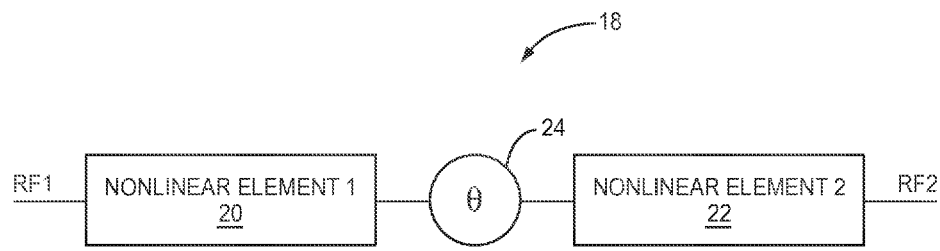
FIG. 3 is a diagram illustrating an embodiment of an RF system that in accordance with the present disclosure provides intermodulation (IM) suppression generated by signals propagating through the RF system.

FIG. 3 is a diagram illustrating an embodiment of an RF system 18 that in accordance with the present disclosure provides intermodulation (IM) suppression generated by signals propagating through the RF system 18. In this embodiment, the RF system 18 includes a first nonlinear element 20 that generates inherent IM products and a second nonlinear element 22 that is adapted to generate compensating IM products having amplitudes that are substantially equal to amplitudes of the inherent IM products. A phase shifter 24 is adapted to provide a phase shift that results in around 180° of phase shift between the inherent IM products and the compensating IM products. The phase shifter 24 is coupled in series with the first nonlinear element 20 and the second nonlinear element 22. In this particular embodiment, the phase shifter 24 is coupled between the first nonlinear element 20 and the second nonlinear element 22. The RF system 18 also includes a first RF port RF1 coupled to the first nonlinear element 20 and a second RF port RF2 coupled to the second nonlinear element 22. Signals enter and exit through the first RF port RF1 and the second RF port RF2.

In at least one embodiment, the first RF port RF1 is a terminal for a transmit/receive (T/R) switch comprising the first nonlinear element 20 while the RF port RF2 is a terminal for an antenna (not shown). In this embodiment, the second nonlinear element 22 is an auxiliary nonlinear component that is adapted to generate the compensating IM products having effectively the same amplitude as the inherent IM products generated by the T/R switch making up the first nonlinear element 20. By appropriately adjusting the phase shift of the phase shifter 24, desired ones of the IM products will at worst be greatly reduced and at best be effectively canceled. As a result, IM products that normally leak through the first RF port RF1 and the second RF port RF2 are no longer a concern.

Figure 4:
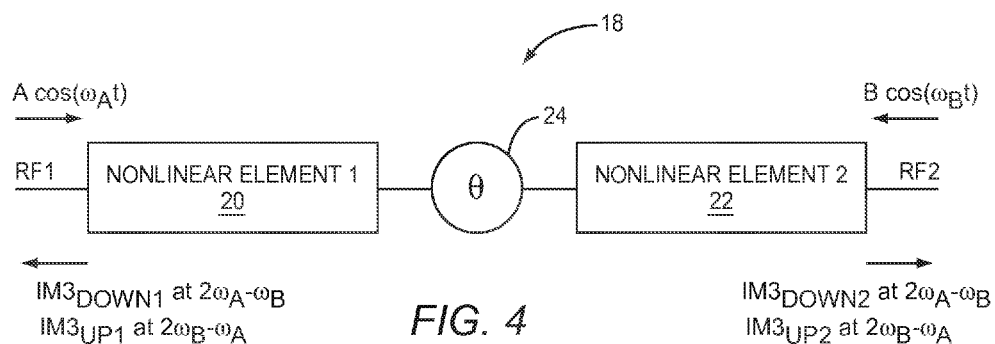
FIG. 4 is a diagram depicting a first signal incident upon a first RF port and a second signal incident upon a second RF port of the RF system.

FIG. 4 is a diagram of the RF system 18 depicting a situation in which a first signal $A \cdot \cos(\omega_A t)$ is incident upon the first RF port RF1 and a second signal $B \cdot \cos(\omega_B t)$ is incident upon the second RF port RF2. Generated IM products will also undergo a phase shift by a phase shifter such as the phase shifter 24 at IM distortion (IMD) frequencies known as $\omega_{up}$ and $\omega_{down}$. The IMD frequency $\omega_{up}$ is equal to $2\omega_B - \omega_A$ and the IMD frequency $\omega_{down}$ is equal to $2\omega_A - \omega_B$. Generated IM products having the IMD frequency $\omega_{up}$ and the IMD frequency $\omega_{down}$ leak through the first RF port RF1 and the second RF port RF2.

Figure 5:
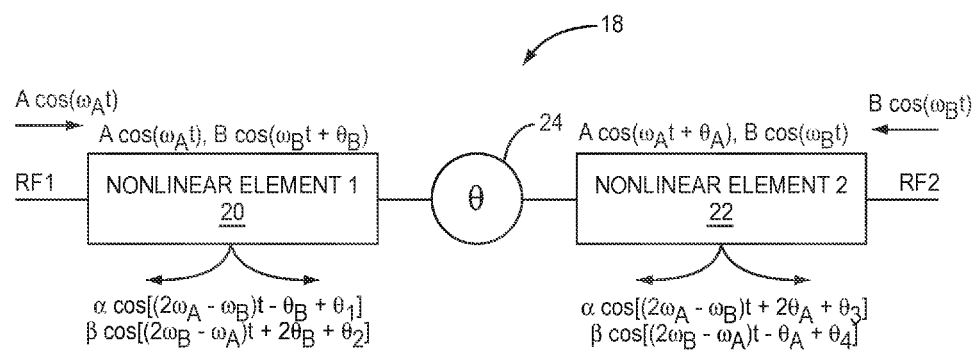
FIG. 5 is a diagram of the RF system depicting third order intermodulation (IM3) products that are generated in response to propagations of the first signal and the second signal through the RF system.

FIG. 5 is a diagram of the RF system 18 depicting third order intermodulation (IM3) products that are generated in response to the first signal $A \cdot \cos(\omega_A t)$ and the second signal $B \cdot \cos(\omega_B t)$ propagating through the RF system 18. The first signal $A \cdot \cos(\omega_A t)$ and the second signal $B \cdot \cos(\omega_B t)$ are two tones that mix within the nonlinear elements to produce IM3 products and other IM products such as second order (IM2) products as well as higher order IM products. The second signal $B \cdot \cos(\omega_B t)$ will undergo a phase shift equal to a phase shift $\theta_B$ before reaching the first nonlinear element 20. Thus, the first signal $A \cdot \cos(\omega_A t)$ and the second signal $B \cdot \cos(\omega_B t)$ after undergoing the phase shift $\theta_B$ (i.e., $B \cdot \cos(\omega_B t + \theta_B)$) will propagate within the first nonlinear element 20. Similarly, the second signal $B \cdot \cos(\omega_B t)$ and the first signal $A \cdot \cos(\omega_A t)$ after undergoing the phase shift $\theta_A$ (i.e., $A \cdot \cos(\omega_A t + \theta_A)$) will propagate within the second nonlinear element 22. For the purpose of this disclosure a phase shift $\theta_X$ (x=1, 2, 3, 4) is the phase of an IM product generated at a given frequency and by a given nonlinear element such as the first nonlinear element 20 and the second nonlinear element 22. For example, the phase shift $\theta_1$ is the phase shift of an IM product at the $\omega_{down}$ frequency generated by the first nonlinear element 20.

Figure 6:
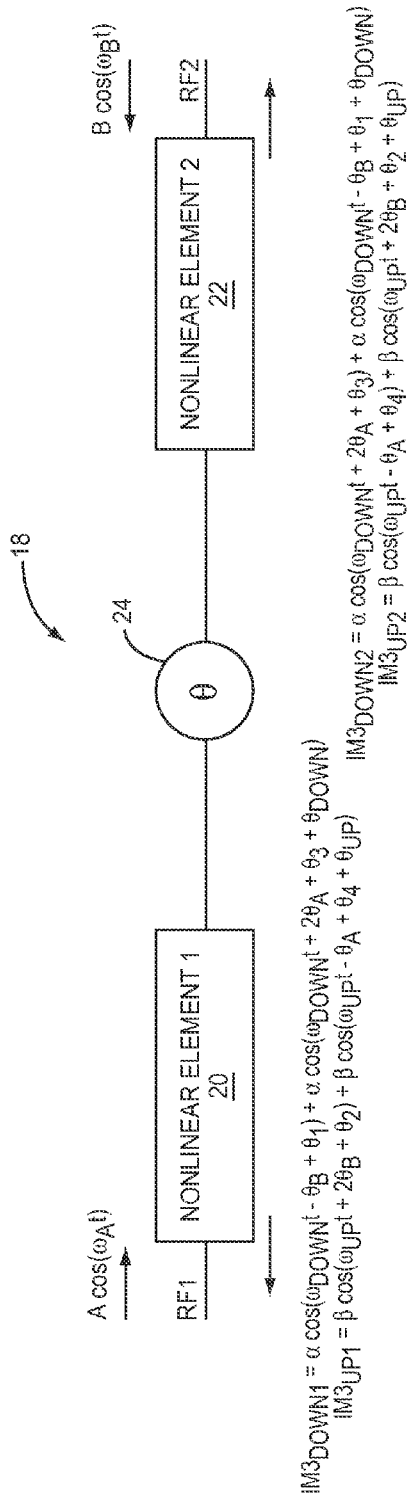
FIG. 6 is a diagram of the RF system depicting third order IM (IM3) products leaking through the first RF port and the second RF port.

FIG. 6 is a diagram of the RF system 18 depicting the generation of IM3 products that leak through the first RF port RF1 and the second RF port RF2. A set of IM3 products for the depicted situation are given by the following equations.

$$IM3_{down1} = \alpha \cdot \cos(\omega_{down} t - \theta_B + \theta_1) + \alpha \cdot \cos(\omega_{down} t + 2\theta_A + \theta_3 + \theta_{down})$$

$$IM3_{up1} = \beta \cdot \cos(\omega_{up} t + 2\theta_B + \theta_2) + \beta \cdot \cos(\omega_{up} t - \theta_A + \theta_4 + \theta_{up})$$

$$IM3_{down2} = \alpha \cdot \cos[\omega_{down} t + 2\theta_A + \theta_3] + \alpha \cdot \cos(\omega_{down} t - \theta_B + \theta_1 + \theta_{down})$$

$$IM3_{up2} = \beta \cdot \cos(\omega_{up} t - \theta_A + \theta_4) + \beta \cdot \cos(\omega_{up} t + 2\theta_B + \theta_2 + \theta_{up})$$

As a result of the above equations, the following conditions need to be satisfied in order to effectively cancel desired IM3 products at the first RF port RF1 and the second RF port RF2.

$IM3_{down1}$ at RF1 to cancel: $180° - \theta_B + \theta_1 = 2\theta_A + \theta_3 + \theta_{down}$ $IM3_{up1}$ at RF1 to cancel: $180° + 2\theta_B + \theta_2 = -\theta_A + \theta_4 + \theta_{up}$ $IM3_{down2}$ at RF2 to cancel: $180° + 2\theta_A + \theta_3 = -\theta_B + \theta_1 + \theta_{down}$ $IM3_{up2}$ at RF2 to cancel: $180° - \theta_A + \theta_4 = 2\theta_B + \theta_2 + \theta_{up}$ If the first nonlinear element 20 and the second nonlinear element 22 have identical nonlinear properties, the phase shift $\theta_1$ is equal to the phase shift $\theta_3$, and the phase shift $\theta_2$ is equal to the phase shift $\theta_4$ since the phase shift $\theta_1$ and the phase shift $\theta_3$ are generated at $\omega_{down}$ while the other phase shifts are generated at $\omega_{up}$. Moreover, assuming that the phase shifter 24 provides a same phase shift for the first signal $A \cdot \cos(\omega_A t)$ and the second signal $B \cdot \cos(\omega_B t)$ and the generated IM3 products the above equations will reduce to specific phase shifts. For example, in order to effectively cancel the IM3 down product at the first RF port RF1 and the $IM3_{up}$ product at the second RF port RF2, the phase shifter 24 should provide a 45° phase shift. In order to effectively cancel the $IM3_{up}$ product at the first RF port RF1 and the $IM3_{down}$ product at the second RF port RF2, the phase shifter 24 should provide a 90° phase shift. However, it should be understood that the phase shifts needed to cancel IM products can be arbitrary as long as the phase shifter 24 is adapted such that above equations are satisfied.

Figure 7:
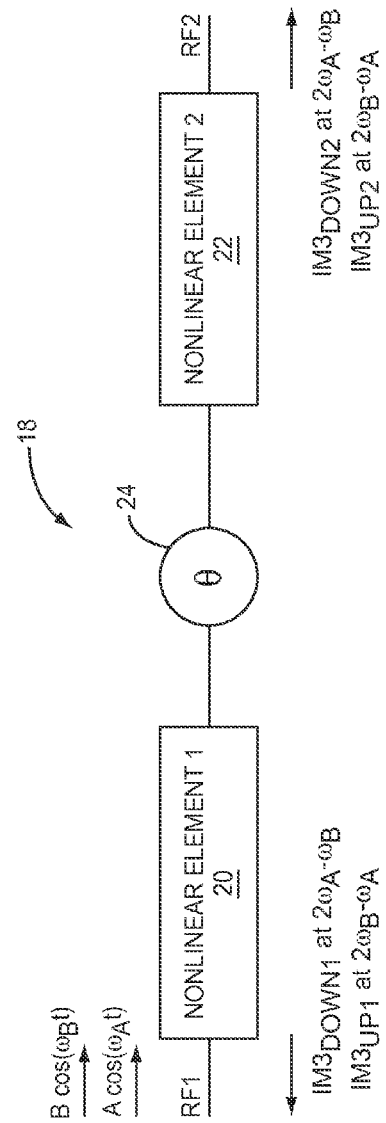
FIG. 7 is a diagram of the RF system depicting the propagation of IM3 products generated when the first signal and the second propagate through the first RF port towards the second RF port.

FIG. 7 is a diagram of the RF system 18 depicting a situation in which the IM3 products are generated as the first signal $A \cdot \cos(\omega_A t)$ and the second signal $B \cdot \cos(\omega_B t)$ propagate through the first RF port RF1 towards the second RF port RF2. Conditions needed to effectively eliminate selected ones of the IM3 products from reaching the first RF port RF1 and the second port RF2 can be developed. These conditions will be similar to the equations depicted for the situation depicted in FIGS. 4 through 6. Moreover, these equations are reducible to yield specific phase shifts to be provided by the phase shifter 24.

Figure 8:
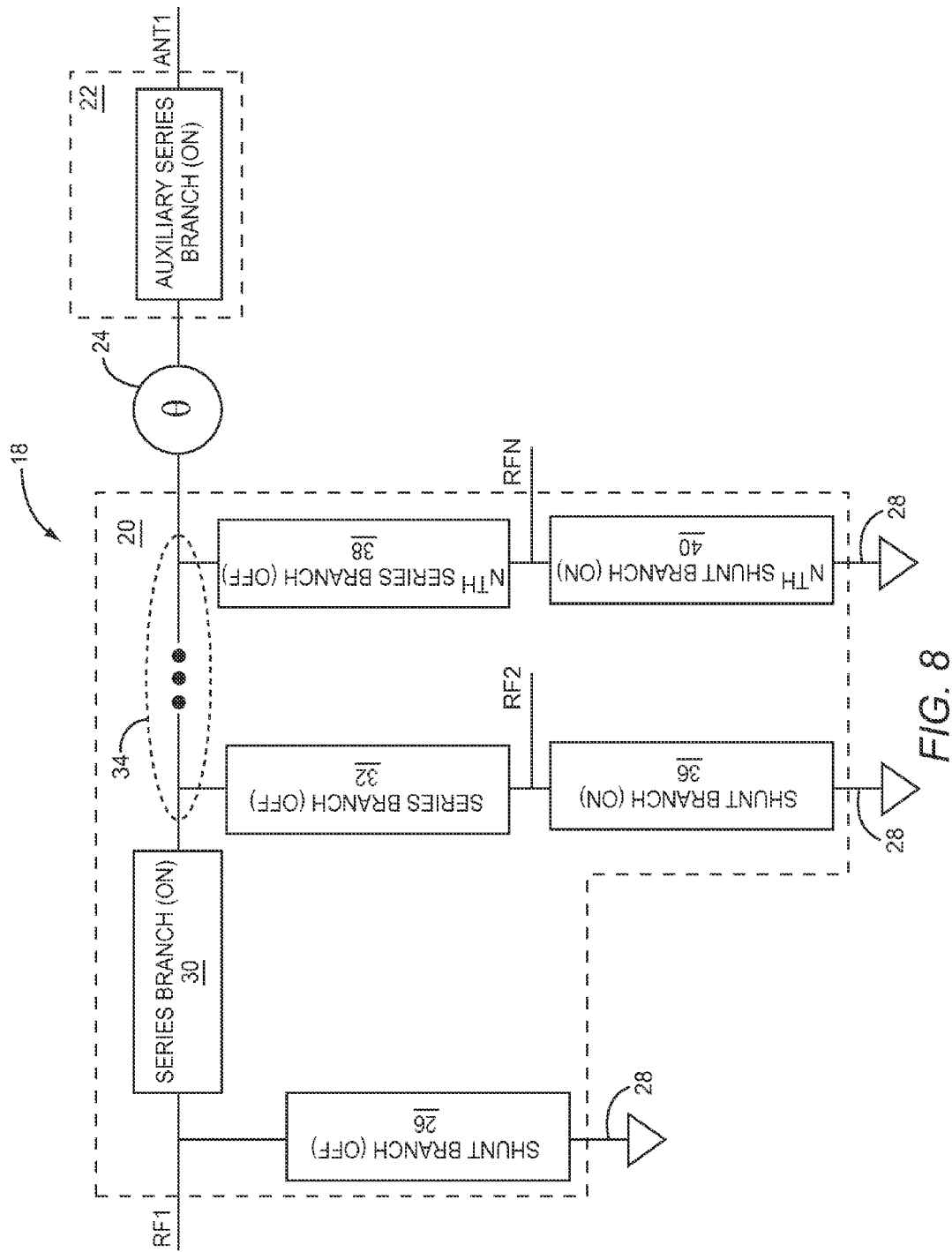

FIG. 8 depicts one embodiment of the RF system 18 that is usable in RF front-ends. For this embodiment, the first nonlinear element 20 generates inherent IM products and the second nonlinear element 22 is adapted to generate compensating IM products. The second nonlinear element 22 is scaled such that the compensating IM products have amplitudes that are substantially equal to the inherent IM products. Moreover, in this particular embodiment, the first nonlinear element 20 is a single pole N throw (SPNT) switch, wherein N is an integer number that is greater than or equal to 2. In particular, the first nonlinear element 20 includes a first shunt branch 26 coupled between the first RF port RF1 and a return node 28, a first series branch 30 coupled between the phase shifter 24 and the first RF port RF1, a second series branch 32 coupled between a node 34 and the second RF port RF2, wherein the node 34 is located between the first series branch 30 and the phase shifter 24. A second shunt branch 36 is coupled between the second RF port RF2 and the return node 28. Additional RF ports can be included in the RF system 18. For example, an $N^{TH}$ RF port RFN is coupled between an $N^{TH}$ series branch 38 and an $N^{TH}$ shunt branch 40, wherein the $N^{TH}$ series branch 38 and the $N^{TH}$ shunt branch 40 are coupled between the node 34 and the return node 28. The return node 28 is typically at ground potential.

The second nonlinear element 22 is an auxiliary series branch that is coupled between an antenna terminal ANT1 and the phase shifter 24. Preferably, the auxiliary series branch of the second nonlinear element 22 comprises a stack of field effect transistors (FETs). The number of FETs making up the stack and the device size of each of the FETs are selected such that the amplitudes of the IM3 products generated by the second nonlinear element 22 is effectively equal to the IM3 products generated by the first nonlinear element 20. In this particular configuration of the RF system 18, IM3 cancelation will be effective as long as the phase shifter 24 provides a phase shift θ that combined with inherent phase shifts will place the amplitudes of the IM3 products generated by the first nonlinear element 20 about 180° out of phase with the IM3 products generated by the second nonlinear element 22.

In order to transmit a signal through the first RF port RF1 to the antenna terminal ANT1 in a first switch mode, the first shunt branch 26 is off and the first series branch 30 is on, while the second series branch 32 through the $N^{TH}$ series branch 38 are off and the second shunt branch 36 through the $N^{TH}$ shunt branch 40 are on. Simultaneously, the auxiliary series branch comprising the second nonlinear element 22 is on. In order to transmit a signal through the second RF port RF2 in a second switch mode, the second series branch 32 is on and the second shunt branch 36 is off, while the first shunt branch 26 through the $N^{TH}$ shunt branch 40 are on and the first series branch 30 through the $N^{TH}$ series branch 38 are off. In order to transmit a signal through the $N^{TH}$ RF port RFN in an $N^{TH}$ switch mode, the $N^{TH}$ series branch 38 is on and the $N^{TH}$ shunt branch 40 is off, while other shunt branches including the first shunt branch 26 and the second shunt branch 36 are on and other series branches including the first series branch 30 and the second series branch 32 are off. The auxiliary series branch comprising the second nonlinear element 22 remains on. Otherwise, there can be no transmission of signals through the antenna terminal ANT1.

Figure 9:
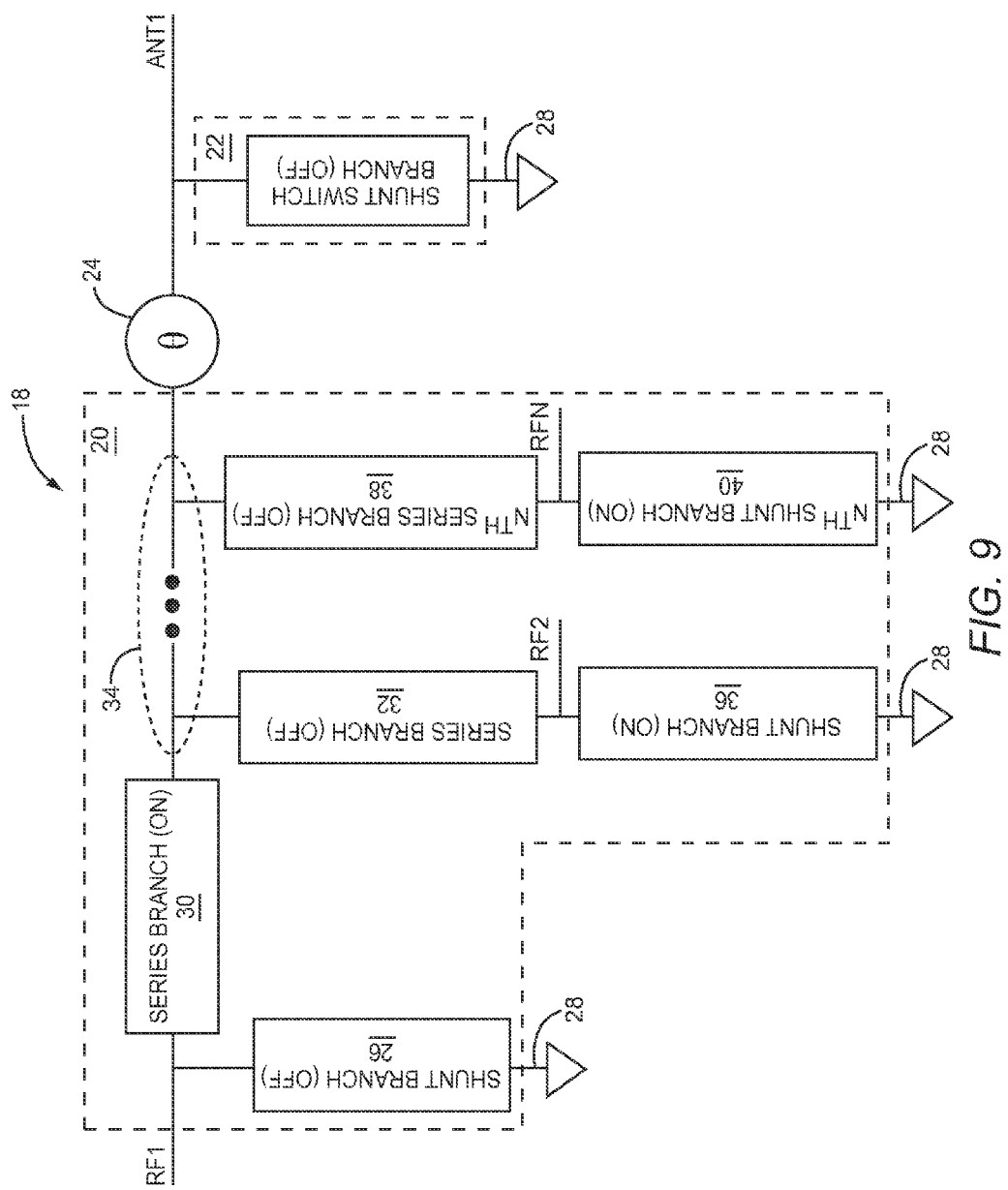
FIG. 9 depicts an embodiment of the RF system in the form of an RF switch having a shunt switch branch that is normally off.

FIG. 9 depicts another embodiment of the RF system 18 that is usable in RF front-ends. Similar to the embodiment of FIG. 8, the first nonlinear element 20 generates inherent IM products and the second nonlinear element 22 is adapted to generate compensating IM products. In this embodiment, the second nonlinear element 22 is scaled such that the compensating IM products have amplitudes that are substantially equal to the inherent IM products. Moreover, in this embodiment, the first nonlinear element 20 retains the first shunt branch 26 coupled to the first RF port RF1, the first series branch 30 coupled between the phase shifter 24 and the first RF port RF1, the second series branch 32 coupled between the phase shifter 24 and the second RF port RF2, and the second shunt branch 36 coupled between the second RF port RF2 and the return node 28. The $N^{TH}$ RF port RFN is coupled between an $N^{TH}$ series branch 38 and an $N^{TH}$ shunt branch 40, wherein the $N^{TH}$ series branch 38 and the $N^{TH}$ shunt branch 40 are coupled between the node 34 and the return node 28. The return node 28 is typically at ground potential. In one embodiment, the second nonlinear element 22 is an anti-serial diode stack. In yet another embodiment, the second nonlinear element 22 is a shunt branch that is always off during operation of the RF system 18. More generally, the second nonlinear element is a load that does not significantly interfere with a signal being transmitted, but is fabricated to generate compensating IM products that after an appropriate phase shift cancel with inherent IM products generated by the first nonlinear element 20.

In order to transmit a signal through the first RF port RF1 to the antenna terminal ANT1 during the first switch mode, the first shunt branch 26 is off and the first series branch 30 is on, while the second series branch 32 through the $N^{TH}$ series branch 38 are off and the second shunt branch 36 through the $N^{TH}$ shunt branch are on. Simultaneously, the auxiliary shunt branch comprising the second nonlinear element 22 is off. In order to transmit a signal through the second RF port RF2 in the second switch mode, the second series branch 32 is on and the second shunt branch 36 is off, while the first shunt branch 26 through the $N^{TH}$ shunt branch 40 are on and the first series branch 30 through the $N^{TH}$ series branch 38 are off. In order to transmit a signal through the $N^{TH}$ RF port RFN in an $N^{TH}$ switch mode, the $N^{TH}$ series branch 38 is on and the $N^{TH}$ shunt branch 40 is off, while other shunt branches including the first shunt branch 26 and the second shunt branch 36 are on and other series branches including the first series branch 30 and the second series branch 32 are off. The shunt branch comprising the second nonlinear element 22 remains off. Otherwise, there would be no transmission of signals through the antenna terminal ANT1. An insertion loss for the embodiment of FIG. 9 is less than the insertion loss for the embodiment of FIG. 8 due to the second nonlinear element 22 being shunt and off.

Figure 10:
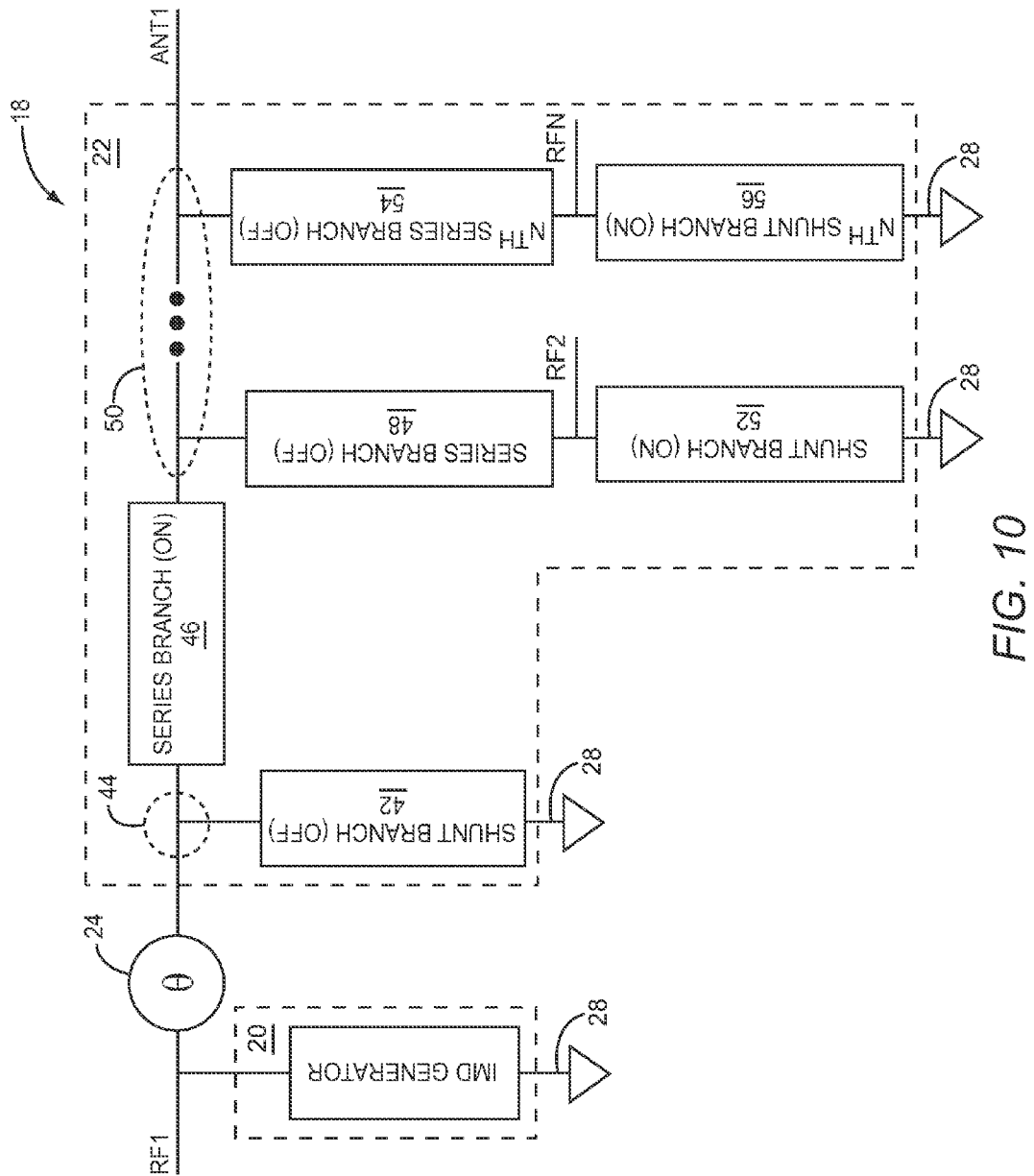
FIG. 10 depicts an embodiment of the RF system in the form of an RF switch having a shunt IM distortion (IMD) generator branch.

FIG. 10 depicts yet another embodiment of the RF system 18 that is usable in RF front-ends. In this embodiment, a shunt IMD generator comprises the first nonlinear element 20 that generates compensating IM products to cancel with inherent IM products generated by the second nonlinear element 22. The shunt IMD generator comprising first nonlinear element 20 is coupled between the first RF port RF1 and the return node 28. The phase shifter 24 is coupled between the second nonlinear element 22 and the first RF port RF1. In this embodiment, the second nonlinear element 22 is a single pole N throw (SPNT) switch having a first shunt branch 42 coupled between a first node 44 and the return node 28, wherein the first node 44 is located between the phase shifter 24 and a first series branch 46 coupled between the phase shifter 24 and the antenna terminal ANT1. A second series branch 48 is coupled between a second node 50 and the second RF port RF2, and a second shunt branch 52 is coupled between the second RF port RF2 and the return node 28, wherein the second node 50 is located between the antenna terminal ANT1 and the first series branch 46. The $N^{TH}$ RF port RFN is coupled between the $N^{TH}$ series branch 54 and the $N^{TH}$ shunt branch 56, which are coupled between the second node 50 and the return node 28. The return node 28 is typically ground.

In order to transmit a signal through the first RF port RF1 to the antenna terminal ANT1 during the first switch mode, the first shunt branch 42 is off and the first series branch 46 is on, while the second series branch 48 through the $N^{TH}$ series branch 54 are off and the second shunt branch 52 through the $N^{TH}$ shunt branch 56 are on. Simultaneously, the shunt IMD generator comprising the first nonlinear element 20 is off. In order to transmit a signal through the second RF port RF2 during the second switch mode, the first shunt branch 42 through the $N^{TH}$ shunt branch 56 are on and the first series branch 46 through the $N^{TH}$ series branch 54 are off, while the second series branch 48 is on and the second shunt branch 52 is off. In order to transmit a signal through the $N^{TH}$ RF port RFN in an $N^{TH}$ switch mode, the $N^{TH}$ series branch 54 is on and the $N^{TH}$ shunt branch 56 is off, while other shunt branches including the first shunt branch 42 and the second shunt branch 52 are on and other series branches including the first series branch 46 and the second series branch 48 are off. It should be noted that the configuration of the embodiment of the RF system 18 of FIG. 10 only cancels IM3 products in the first switch mode. Thus, for an $N^{TH}$ switch mode, the state of the first nonlinear element 20 is inconsequential.

Figure 11:
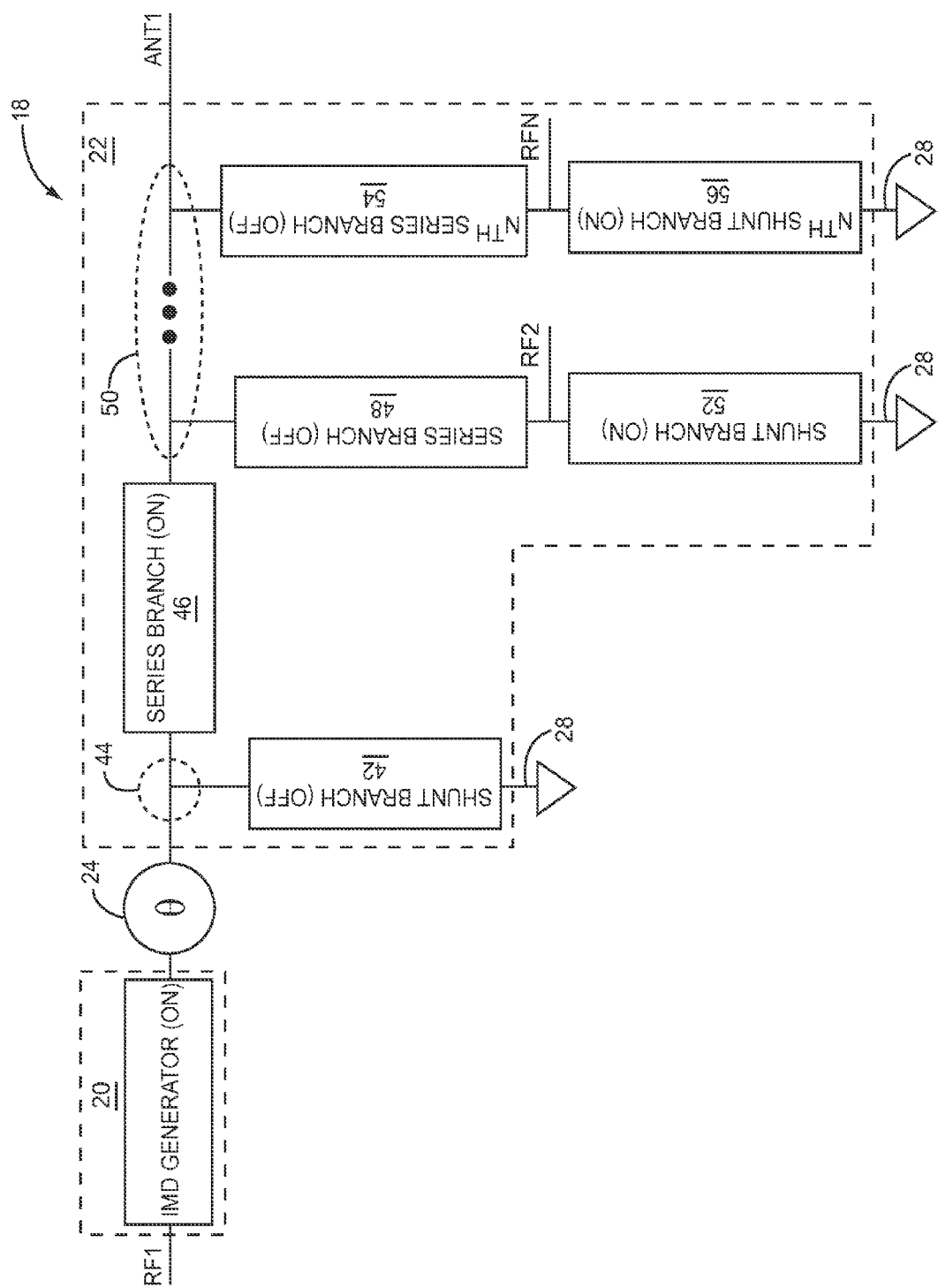
FIG. 11 depicts an embodiment of the RF system in the form of an RF switch having a series IMD generator branch.

FIG. 11 depicts an embodiment of the RF system 18 in the form of an RF switch having a series IMD generator branch that comprises the first nonlinear element 20 that generates compensating IM products to cancel with inherent IM products generated by the second nonlinear element 22. The series IMD generator comprising the first nonlinear element 20 is coupled between the first RF port RF1 and the phase shifter 24. In this embodiment, the second nonlinear element 22 retains the first shunt branch 42 coupled to the first node 44, the first series branch 46 coupled between the phase shifter 24 and the antenna terminal ANT1, the second series branch 48 coupled between the second node 50 and the second RF port RF2, and the second shunt branch 52 coupled between the second RF port RF2 and the return node 28. Additional RF ports can be included in the second nonlinear element 22. For example, the $N^{TH}$ RF port RFN is coupled between the $N^{TH}$ series branch 54 and the $N^{TH}$ shunt branch 56 that are coupled between the second node 50 and the return node 28. The return node 28 is typically ground.

In order to transmit a signal through the first RF port RF1 to the antenna terminal ANT1 during the first switch mode, the first shunt branch 42 is off and the first series branch 46 is on, while the second series branch 48 through the $N^{TH}$ series branch 54 are off and the second shunt branch 52 through the $N^{TH}$ shunt branch 56 are on. Simultaneously, the series IMD generator comprising the first nonlinear element 20 is on. In order to transmit a signal through the second RF port RF2 during the second switch mode, the first shunt branch 42 through the $N^{TH}$ shunt branch 56 are on and the first series branch 46 through the $N^{TH}$ series branch 54 are off, while the second series branch 48 is on and the second shunt branch 52 is off. In order to transmit a signal through the $N^{TH}$ RF port RFN in an $N^{TH}$ switch mode, the $N^{TH}$ series branch 54 is on and the $N^{TH}$ shunt branch 56 is off, while other shunt branches including the first shunt branch 42 and the second shunt branch 52 are on and other series branches including the first series branch 46 and the second series branch 48 are off. It should be noted that the configuration of the embodiment of the RF system 18 of FIG. 11 only cancels IM3 products in the first switch mode. Thus, for an $N^{TH}$ switch mode, the state of the first nonlinear element 20 is inconsequential.

Figure 12:
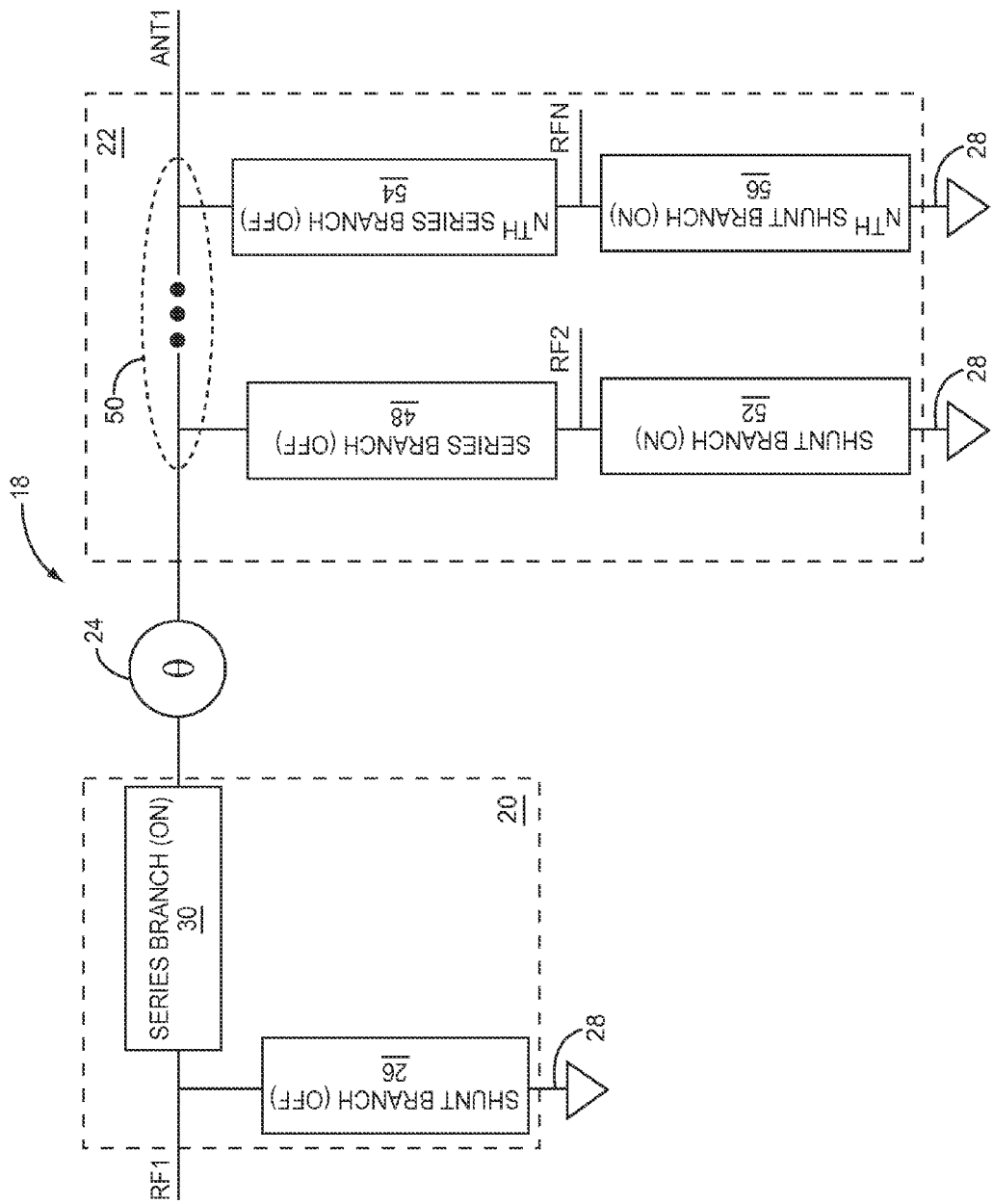

FIG. 12 depicts still yet another embodiment of the RF system 18 that is usable in RF front-ends. In this embodiment, the first nonlinear element 20 is comprised of the first shunt branch 26 coupled between the first RF port RF1 and the return node 28 and the first series branch 30 coupled between the first RF port RF1 and the phase shifter 24. The second nonlinear element 22 retains the second series branch 48 coupled between the second node 50 and the second RF port RF2. The second shunt branch 52 remains coupled between the second RF port RF2 and the return node 28. The $N^{TH}$ RF port RFN is coupled between the $N^{TH}$ series branch 54 and the $N^{TH}$ shunt branch 56, which are coupled between the second node 50 and the return node 28.

In order to transmit a signal through the first RF port RF1 to the antenna terminal ANT1 during the first switch mode, the first shunt branch 26 is off and the first series branch 30 is on, while the second series branch 48 through the $N^{TH}$ series branch 54 are off and the second shunt branch 52 through the $N^{TH}$ shunt branch 56 are on. The phase shifter 24 provides a phase shift θ combined with inherent phase shifts that will place the amplitudes of the IM3 products generated by the first nonlinear element 20 about 180° out of phase with the IM3 products generated by the second nonlinear element 22. In this way, IM3 products generated in the first switch mode will be effectively eliminated. The advantage of this embodiment is that no auxiliary IMD generator is necessary. Therefore, this embodiment yields less insertion loss than the previous embodiments depicted in FIGS. 8 through 11. Moreover, the insertion loss is limited to the RF port RF1. It should also be noted that this embodiment is particularly well suited for implementing higher order switches.

Figure 13:
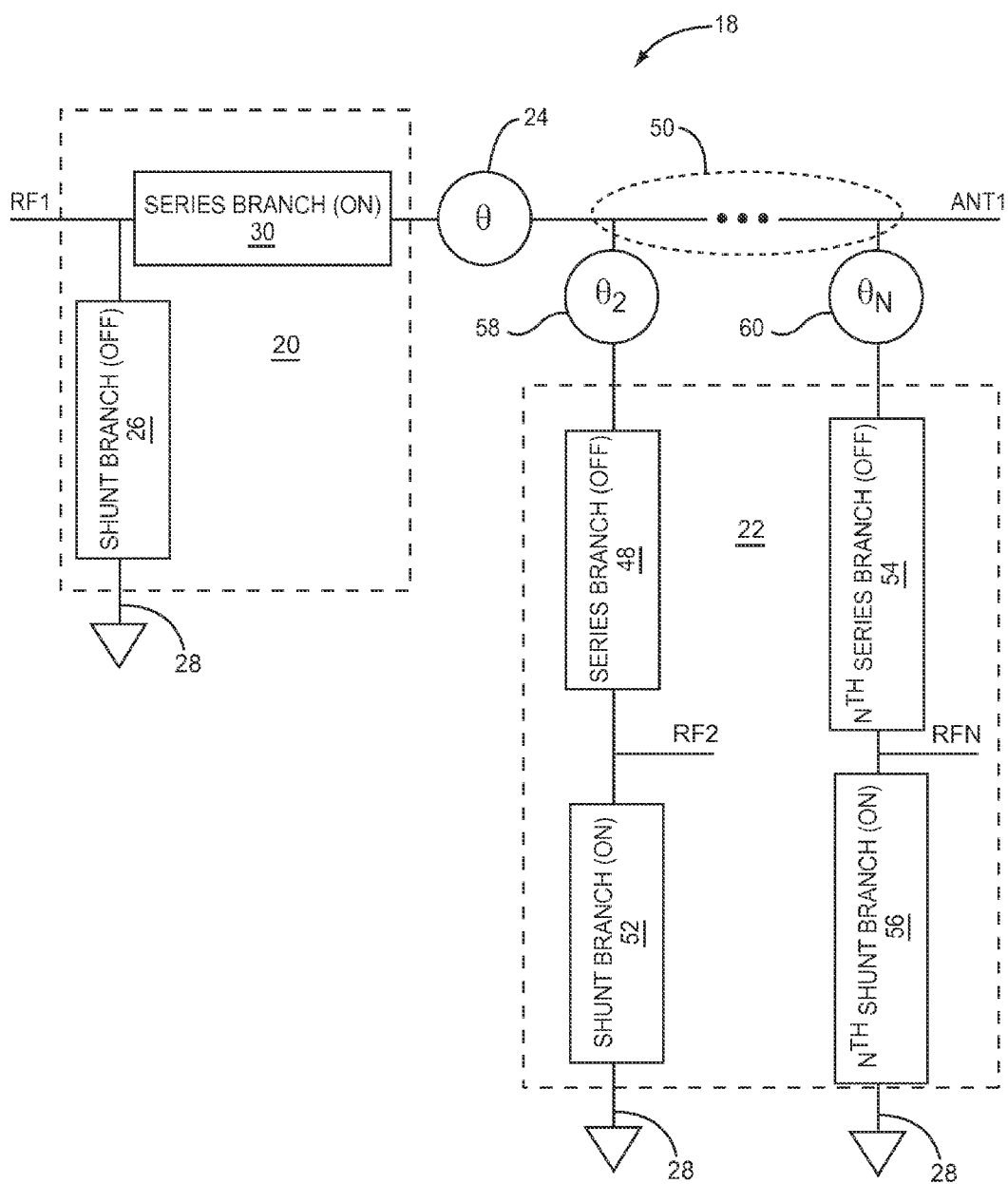
FIG. 13 depicts an embodiment of the RF system in the form of an RF switch that includes a plurality of phase shifters.

FIG. 13 depicts an embodiment that is similar to the embodiment depicted in FIG. 12. However, in this embodiment a plurality of phase shifters including a second phase shifter 58 through an $N^{TH}$ phase shifter 60 are usable to further effectively cancel IM3 products generated by the RF system 18. The second phase shifter 58 is coupled between the second node 50 and the second series branch 48. Similarly, the $N^{TH}$ phase shifter 60 is coupled between the second node 50 and the $N^{TH}$ series branch 54. The $N^{TH}$ RF port RFN is coupled between the $N^{TH}$ series branch 54 and the $N^{TH}$ shunt branch 56 that is coupled to the return node 28.

In order to transmit a signal through the first RF port RF1 to the antenna terminal ANT1 during the first switch mode, the first shunt branch 26 is off and the first series branch 30 is on while the second series branch 48 is off and the second shunt branch 52 is on. Likewise, the $N^{TH}$ series branch 54 is off and the $N^{TH}$ shunt branch 56 is on. In order to transmit a signal through the second RF port RF2 during the second switch mode, the first shunt branch 26 through the $N^{TH}$ shunt branch 56 are on and the first series branch 30 through the $N^{TH}$ series branch 54 are off, while the second series branch 48 is on and the second shunt branch 52 is off. In order to transmit a signal through the $N^{TH}$ RF port RFN in an $N^{TH}$ switch mode, the $N^{TH}$ series branch 54 is on and the $N^{TH}$ shunt branch 56 is off, while other shunt branches including the first shunt branch 26 and the second shunt branch 52 are on and other series branches including the first series branch 30 and the second series branch 48 are off.

Figure 14:
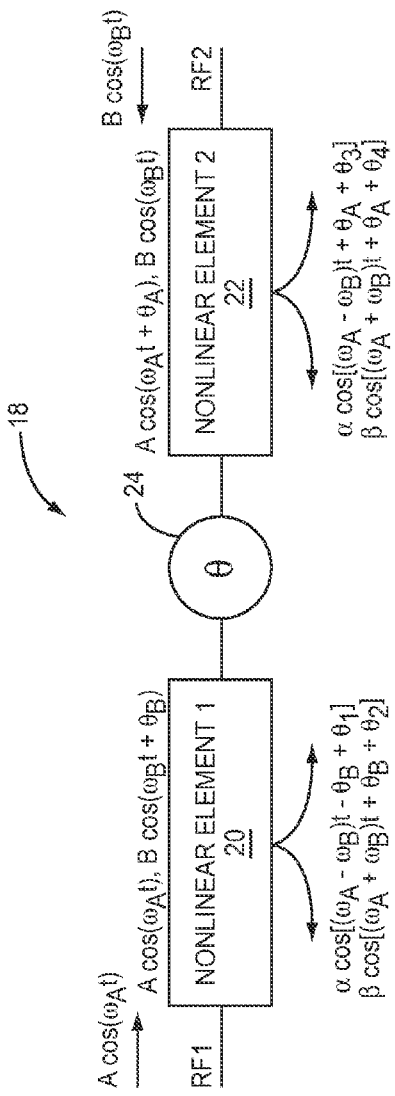
FIG. 14 is diagram of the RF system depicting second order intermodulation (IM2) products that are generated in response to propagations of the first signal and the second signal through the RF system.

FIG. 14 is a diagram of the RF system 18 depicting second order intermodulation (IM2) products that are generated in response to the first signal $A \cdot \cos(\omega_A t)$ and the second signal $B \cdot \cos(\omega_B t)$ propagating through the RF system 18. The first signal $A \cdot \cos(\omega_A t)$ and the second signal $B \cdot \cos(\omega_B t)$ mix within the nonlinear elements to produce IM2 products and other IM products such as IM3 products as well as higher order IM products. The IMD frequency $\omega_{2up}$ is equal to $\omega_A+\omega_B$ and the IMD frequency $\omega_{2down}$ is equal to $\omega_A-\omega_B$ assuming that $\omega_A>\omega_B$. Generated IM2 products having the IMD frequency $\omega_{2up}$ and the IMD frequency $\omega_{2down}$ leak through the first RF port RF1 and the second RF port RF2.

Figure 15:
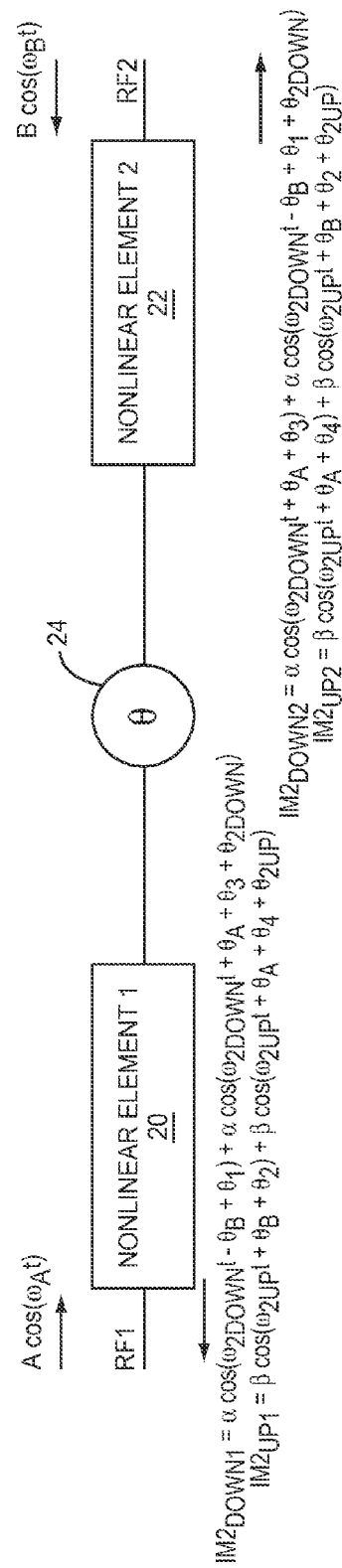
FIG. 15 is a diagram of the RF system depicting second order intermodulation (IM2) products leaking through the first RF port and the second RF port.

FIG. 15 is a diagram of the RF system 18 depicting the generation of IM2 products that leak through the first RF port RF1 and the second RF port RF2. A set of IM2 products for the depicted situation are given by the following equations.

$$IM2_{down1}=\alpha \cdot \cos(\omega_{2down}t-\theta_B+\theta_1)+\alpha \cdot \cos(\omega_{2down}t+\theta_A+\theta_3+\theta_{2down})$$

$$IM2_{up1}=\beta \cdot \cos(\omega_{2up}t+\theta_B+\theta_2)+\beta \cdot \cos(\omega_{2up}t-\theta_A+\theta_4+\theta_{2up})$$

$$IM2_{down2}=\alpha \cdot \cos[\omega_{2down}t+\theta_A+\theta_3)+\alpha \cdot \cos(\omega_{2down}t-\theta_B+\theta_1+\theta_{2down})$$

$$IM2_{up2}=\beta \cdot \cos(\omega_{2up}t-\theta_A+\theta_4)+\beta \cdot \cos(\omega_{2up}t+\theta_B+\theta_2+\theta_{2up})$$

As a result of the above equations, the following conditions need to be satisfied in order to effectively cancel desired IM3 products at the first RF port RF1 and the second RF port RF2.

Figure 16:
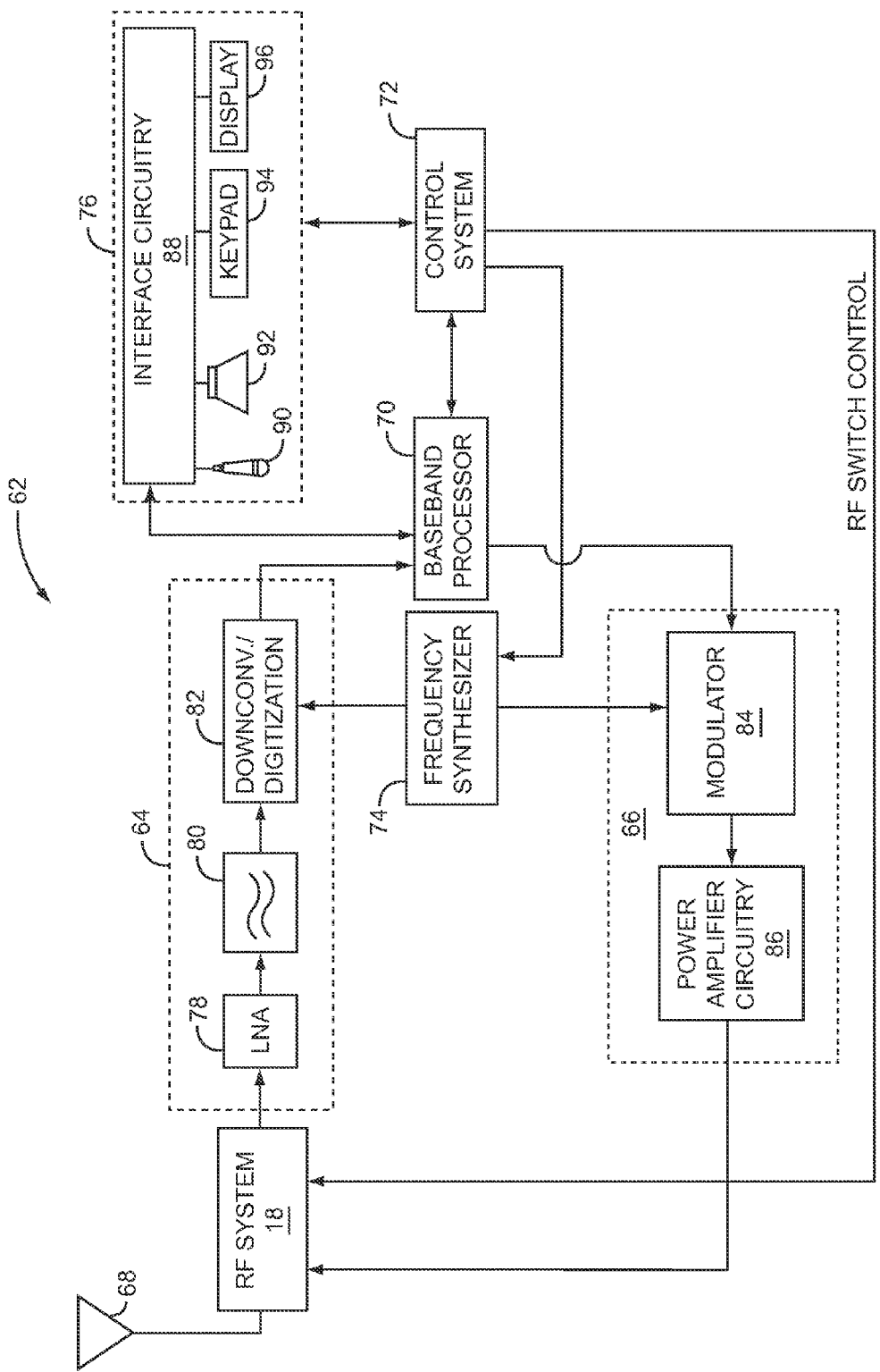
FIG. 16 is a block diagram of a mobile terminal that incorporates an embodiment of an RF system of the present disclosure.

$IM2_{down1}$ at RF1 to cancel: $180°-\theta_B+\theta_1=\theta_A+\theta_3+\theta_{2down}$ $IM2_{up1}$ at RF1 to cancel: $180°+\theta_B+\theta_2=-\theta_A+\theta_4+\theta_{2up}$ $IM2_{down2}$ at RF2 to cancel: $180°+\theta_A+\theta_3=-\theta_B+\theta_1+\theta_{2down}$ $IM2_{up2}$ at RF2 to cancel: $180°+\theta_A+\theta_4=\theta_B+\theta_2+\theta_{2up}$ Turning now to FIG. 16, the RF system 18 is incorporated in a mobile terminal 62, such as a cellular handset, a personal digital assistant (PDA), or the like. The basic architecture of the mobile terminal 62 may include a receiver front end 64, an RF transmitter section 66, an antenna 68, a baseband processor 70, a control system 72, a frequency synthesizer 74, and an interface 76. The receiver front end 64 receives information bearing RF signals from one or more remote transmitters provided by a base station (not shown). A low noise amplifier (LNA) 78 amplifies the signal. A filter circuit 80 minimizes broadband interference in the received signal, while down-conversion and digitization circuitry 82 downconverts the filtered received signal to an intermediate or baseband frequency signal, which is then digitized into one or more digital streams. The receiver front end 64 typically uses one or more mixing frequencies generated by the frequency synthesizer 74.

The baseband processor 70 processes the digitized received signal to extract the information or data bits conveyed in the received signal. This processing typically comprises demodulation, decoding, and error correction operations. As such, the baseband processor 70 is generally implemented in one or more digital signal processors (DSPs).

On the transmit side, the baseband processor 70 receives digitized data, which may represent voice, data, or control information from the control system 72 which it encodes for transmission. The encoded data is output to the RF transmitter section 66, where it is used by a modulator 84 to modulate a carrier signal that is at a desired transmit frequency. Power amplifier (PA) circuitry 86 amplifies the modulated carrier signal to a level appropriate for transmission from the antenna 68.

A user may interact with the mobile terminal 62 via the interface 76, which may include interface circuitry 88 associated with a microphone 90, a speaker 92, a keypad 94, and a display 96. The interface circuitry 88 typically includes analog-to-digital converters, digital-to-analog converters, amplifiers, and the like. Additionally, it may include a voice encoder/decoder, in which case it may communicate directly with the baseband processor 70.

The microphone 90 will typically convert audio input, such as the user's voice, into an electrical signal, which is then digitized and passed directly or indirectly to the baseband processor 70. Audio information encoded in the received signal is recovered by the baseband processor 70 and converted into an analog signal suitable for driving the speaker 92 by the interface circuitry 88. The keypad 94 and the display 96 enable the user to interact with the mobile terminal 62 inputting numbers to be dialed, address book information, or the like, as well as monitoring call progress information.

A simulation of the embodiment of RF system 18 depicted in FIG. 8 was conducted using silicon-on-insulator (SOI) switch circuits. In particular, the first series branch 30 and the second series branch 32 were each simulated using a 14 transistor stack (6 mm). The first shunt branch 26 and the second shunt branch 36 were each simulated using a 14 transistor stack (1 mm). The auxiliary series branch comprising the second nonlinear element 22 was simulated using a six transistor stack (4.15 mm).

Figure 17:
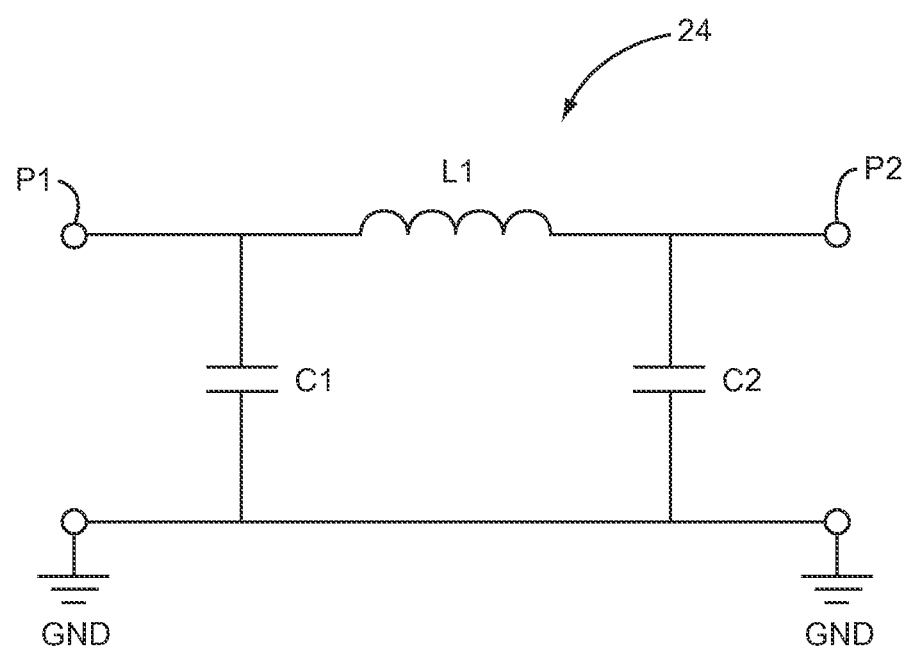
FIG. 17 is a circuit diagram that depicts an exemplary embodiment of a phase shifter.

FIG. 17 depicts a circuit diagram of an exemplary embodiment of the phase shifter 24. As shown in FIG. 17, the phase shifter 24 was simulated using a first shunt capacitor C1 coupled from a first port P1 to ground (GND), a series inductor L1, and a second shunt capacitor C2 coupled from a second port P2 to GND to cancel $IM3_{Low}$ products delivered to the first RF port RF1. A capacitance value of 1.2 pF with a quality (Q) of 50 at 800 MHz was selected for each of the first capacitor C1 and the second capacitor C2. An inductance value of 5.6 nH with a Q of 30 at 800 MHz was selected for the series inductor L1. As a result, the phase shifter 24 provided a phase shift $\theta$ of 34° at 800 MHz to cancel $IM3_{LOW}$ products delivered to the first RF port RF1.

During the simulation, the first signal $A \cdot \cos(\omega_A t)$ was set to a fundamental frequency of 782 MHz in band 13 (B13) with 24 dBm of power incident on the first RF port RF1. The second signal $B \cdot \cos(\omega_B t)$ is a blocker signal set at a fundamental frequency of 827 MHz in B5 with 13 dBm of power incident on the second RF port RF2 incident on the antenna terminal ANT1.

Figure 18:
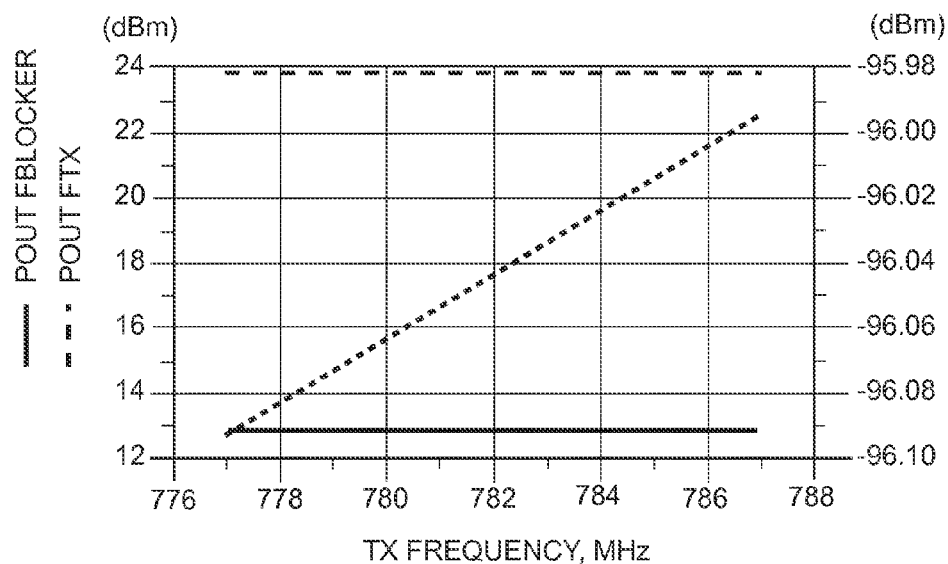
FIG. 18 is a graph depicting simulation results for operation of a regular SP2T switch that only comprises one nonlinear element such as a first nonlinear element shown in FIG. 8.
Figure 19:
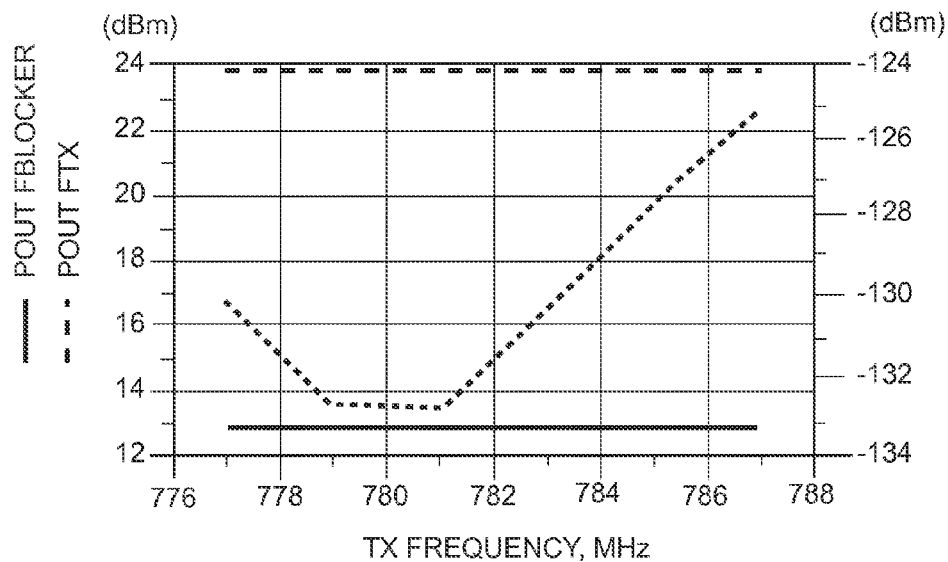
FIG. 19 is a graph that depicts simulation results for operation of the RF system of FIG. 8.

FIG. 18 is a graph depicting simulation results for operation of a regular SP2T switch that only comprises the first nonlinear element 20 (FIG. 8). FIG. 19 is a graph depicting simulation results for the operation of the RF system 18 (FIG. 8) that includes the benefit of both the auxiliary series branch comprising the second nonlinear element 22 and the phase shifter 24. A comparison of the graph of FIG. 18 with the graph of FIG. 19 shows that the RF system 18 of FIG. 8 provides about 34 dB of IM3 reduction over the regular SP2T switch. This amount of reduction in IM3 products holds true for either the first signal that simulates a desired transmit signal or for the second signal that simulates a blocker signal.

Figure 20:
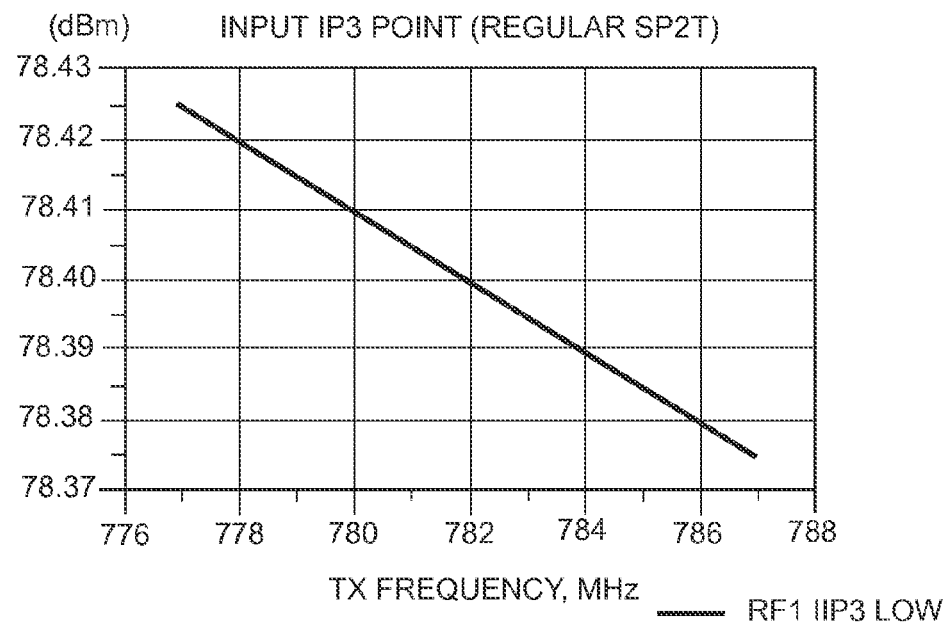
FIG. 20 is a graph depicting a third order intercept point (IP3) for a regular SP2T switch that only comprises one nonlinear element such as the first nonlinear element shown in FIG. 8.
Figure 21:
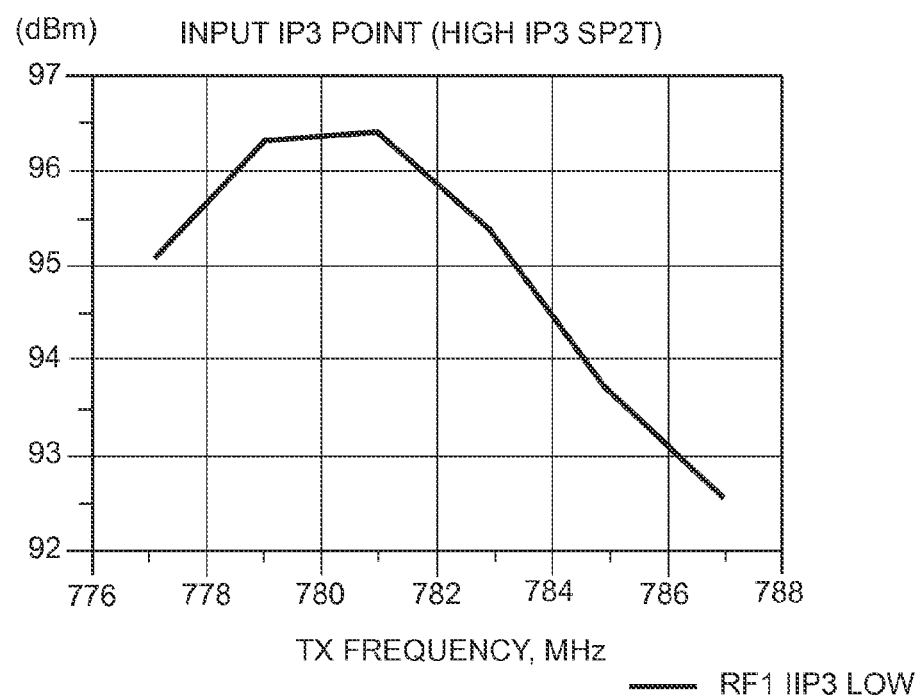
FIG. 21 is a graph depicting a third order intercept point (IP3) for the high SP2T switch that is modeled using the RF system of FIG. 8.

FIG. 20 is a graph depicting a third order intercept point (IP3) for the regular SP2T switch that only comprises the first nonlinear element 20 (FIG. 8). FIG. 21 is a graph depicting a third order intercept point (IP3) for the high IP3 SP2T switch that is modeled using the RF system 18 (FIG. 8) that includes the benefit of both the auxiliary series branch comprising the second nonlinear element 22 and the phase shifter 24. A comparison of the graph of FIG. 20 with the graph of FIG. 21 shows that the RF system 18 of FIG. 8 realizes the high IP3 SP2T switch that provides an IP3 improvement of about 17 dB.

Figure 22:
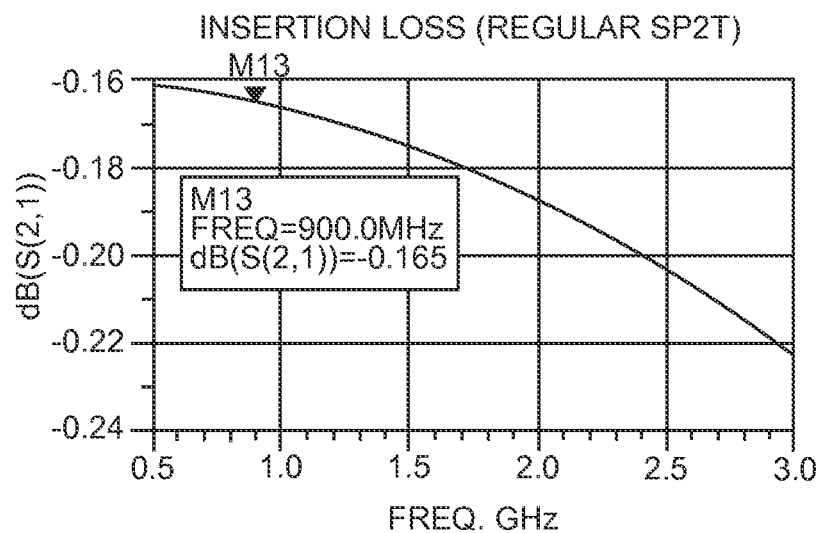
FIG. 22 is a graph depicting insertion loss for the regular SP2T switch that only comprises one nonlinear element such as the first nonlinear element shown in FIG. 8.
Figure 23:
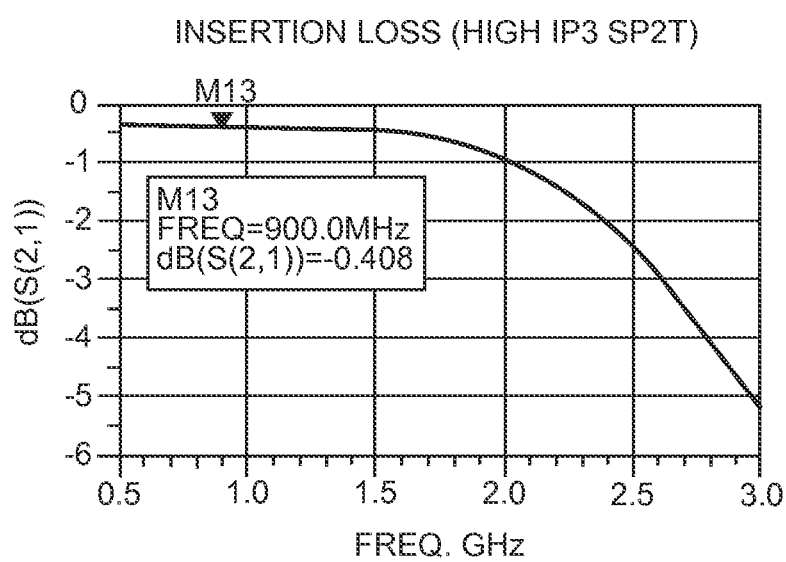
FIG. 23 is a graph depicting insertion loss for the high SP2T switch that is modeled using the RF system of FIG. 8.

FIG. 22 is a graph depicting insertion loss for the regular SP2T switch that only comprises the first nonlinear element 20 (FIG. 8). FIG. 23 is a graph depicting insertion loss for the high IP3 SP2T switch that is modeled using RF system 18 (FIG. 8) that includes the benefit of both the auxiliary series branch comprising the second nonlinear element 22 and the phase shifter 24. As can be seen in a comparison of the graph of FIG. 22 with the graph of FIG. 23, the increase in IP3 comes at the expense of increased insertion loss. For example, a marker m13 in the graph of FIG. 22 displays a dB(S(2,1)) of about −0.17 dB, while the marker m13 in the graph of FIG. 23 displays a dB(S(2,1) of about −0.41 dB. However, it should be understood that the amount of insertion loss suffered depends on the quality of the components such as L1, C1 and C2 used to realize the phase shifter 24 (FIG. 17).

Those skilled in the art will recognize improvements and modifications to the preferred embodiments of the present disclosure. For example, it can be shown that for n≥2, phase shifters can be designed such that desired IM(n) products can be effectively eliminated for desired frequencies and ports. All such improvements and modifications are considered within the scope of the concepts disclosed herein and the claims that follow.

What is claimed is:

1. An RF system for reducing intermodulation (IM) products, comprising:
a first nonlinear element;
a second nonlinear element, wherein the second nonlinear element generates inherent IM products and the first nonlinear element is adapted to generate compensating IM products, or wherein the first nonlinear element generates inherent IM products and the second nonlinear element is adapted to generate compensating IM products; and
a first phase shifter adapted to provide a phase shift that results in around 180° of phase shift between the inherent IM products and the compensating IM products, the first phase shifter being coupled between the first nonlinear element and the second nonlinear element.

2. The RF system of claim 1 wherein the compensating IM products have amplitudes that are substantially equal to amplitudes of the inherent IM products.

3. The RF system of claim 1 wherein the first nonlinear element comprises a first shunt branch coupled between a first RF port and a return node, a first series branch that is coupled between the first RF port and the first phase shifter via a node between the first series branch and the first phase shifter, an $N^{TH}$ series branch coupled between the node and an $N^{TH}$ RF port, and an $N^{TH}$ shunt branch coupled between the $N^{TH}$ RF port and the return node, wherein N is an integer greater than or equal to 2.

4. The RF system of claim 3 wherein the return node is ground.

5. The RF system of claim 3 wherein the second nonlinear element comprises an auxiliary series branch that is adapted to conduct constantly while generating the compensating IM products.

6. The RF system of claim 3 wherein the second nonlinear element comprises a shunt branch that is adapted to be constantly nonconductive while generating the compensating IM products.

7. The RF system of claim 1 wherein the second nonlinear element comprises a first series branch coupled between an antenna terminal and the first phase shifter via a first node between the first series branch and the first phase shifter and a second node between the antenna terminal and the first series branch, a first shunt branch coupled between the first node and a return node, an $N^{TH}$ series branch coupled between the second node and an $N^{TH}$ RF port, and an $N^{TH}$ shunt branch coupled between the $N^{TH}$ RF port and the return node, wherein N is an integer greater than or equal to 2.

8. The RF system of claim 7 wherein the return node is ground.

9. The RF system of claim 7 wherein the first nonlinear element comprises a shunt branch that is an IM distortion (IMD) generator.

10. The RF system of claim 7 wherein the first nonlinear element comprises a series branch that is an IMD generator.

11. The RF system of claim 1 wherein the first nonlinear element comprises a first series branch coupled between a first RF port and the first phase shifter and a first shunt branch coupled between the first RF port and a return node, and wherein the second nonlinear element comprises an $N^{TH}$ series branch coupled between an $N^{TH}$ RF port and a node that couples the first phase shifter to an antenna terminal, and an $N^{TH}$ shunt branch coupled between the $N^{TH}$ RF port and the return node, wherein N is an integer greater than or equal to 2.

12. The RF system of claim 1 further including an $N^{TH}$ phase shifter coupled between a node and the second nonlinear element, wherein the node couples the first phase shifter to an antenna terminal, and wherein N is an integer greater than or equal to 2.

13. The RF system of claim 12 wherein the second nonlinear element comprises an $N^{TH}$ series branch coupled between the $N^{TH}$ phase shifter and an $N^{TH}$ RF port, and an $N^{TH}$ shunt branch coupled between the $N^{TH}$ RF port and a return node, wherein N is an integer greater than or equal to 2.

14. The RF system of claim 13 wherein the first nonlinear element comprises a first series branch coupled between a first RF port and the first phase shifter and a first shunt branch coupled between the first RF port and the return node.

15. The RF system of claim 14 wherein the return node is ground.

16. A mobile terminal comprising:
an antenna;
a receiver front end;
an RF system having a first RF port coupled to the receiver front end and at least one RF port coupled to the antenna, the RF system comprising:
a first nonlinear element;
a second nonlinear element, wherein the second nonlinear element generates inherent IM products and the first nonlinear element is adapted to generate compensating IM products, or wherein the first nonlinear element generates inherent IM products and the second nonlinear element is adapted to generate compensating IM products; and
a first phase shifter adapted to provide a phase shift that results in around 180° of phase shift between the inherent IM products and the compensating IM products, the first phase shifter being coupled between the first nonlinear element and the second nonlinear element; and
a control system communicatively coupled to a control terminal for selecting switching modes of the RF system.

17. The mobile terminal of claim 16 wherein the compensating IM products have amplitudes that are substantially equal to amplitudes of the inherent IM products.

18. The mobile terminal of claim 16 wherein the first nonlinear element comprises a first shunt branch coupled between a first RF port and a return node, a first series branch that is coupled between the first RF port and the first phase shifter via a node between the first series branch and the first phase shifter, an $N^{TH}$ series branch coupled between the node and an $N^{TH}$ RF port, and an $N^{TH}$ shunt branch coupled between the $N^{TH}$ RF port and the return node, wherein N is an integer greater than or equal to 2.

19. The mobile terminal of claim 18 wherein the return node is ground.

20. The mobile terminal of claim 18 wherein the second nonlinear element comprises an auxiliary series branch that is adapted to conduct constantly while generating the compensating IM products.

21. The mobile terminal of claim 18 wherein the second nonlinear element comprises a shunt branch that is adapted to be constantly nonconductive while generating the compensating IM products.

22. The mobile terminal of claim 16 wherein the second nonlinear element comprises a first series branch coupled between an antenna terminal and the first phase shifter via a first node between the first series branch and the first phase shifter and a second node between the antenna terminal and the first series branch, a first shunt branch coupled between the first node and a return node, an $N^{TH}$ series branch coupled between the second node and an $N^{TH}$ RF port, and an $N^{TH}$ shunt branch coupled between the $N^{TH}$ RF port and the return node, wherein N is an integer greater than or equal to 2.

23. The mobile terminal of claim 22 wherein the return node is ground.

24. The mobile terminal of claim 22 wherein the first nonlinear element comprises a shunt branch that is an IM distortion (IMD) generator.

25. The mobile terminal of claim 22 wherein the first nonlinear element comprises a series branch that is an IMD generator.

26. The mobile terminal of claim 16 wherein the first nonlinear element comprises a first series branch coupled between a first RF port and the first phase shifter and a first shunt branch coupled between the first RF port and a return node, and wherein the second nonlinear element comprises an $N^{TH}$ series branch coupled between an $N^{TH}$ RF port and a node that couples the first phase shifter to an antenna terminal, and an $N^{TH}$ shunt branch coupled between the $N^{TH}$ RF port and the return node, wherein N is an integer greater than or equal to 2.

27. The mobile terminal of claim 16 further including an $N^{TH}$ phase shifter coupled between a node and the second nonlinear element, wherein the node couples the first phase shifter to an antenna terminal, and wherein N is an integer greater than or equal to 2.

28. The mobile terminal of claim 27 wherein the second nonlinear element comprises an $N^{TH}$ series branch coupled between the $N^{TH}$ phase shifter and an $N^{TH}$ RF port, and an $N^{TH}$ shunt branch coupled between the $N^{TH}$ RF port and a return node, wherein N is an integer greater than or equal to 2.

29. The mobile terminal of claim 28 wherein the first nonlinear element comprises a first series branch coupled between a first RF port and the first phase shifter and a first shunt branch coupled between the first RF port and the return node.

30. The mobile terminal of claim 29 wherein the return node is ground.

* * * * *